United States Patent [19]
Imai et al.

[11] Patent Number: 4,994,415
[45] Date of Patent: Feb. 19, 1991

[54] SIO$_2$-AL$_2$O$_3$-BAO GLASS SUBSTRATES WITH IMPROVED CHEMICAL RESISTANCE FOR USE IN DISPLAY PANELS AND OTHERS HAVING THIN FILMS

[75] Inventors: Katsuhiko Imai, Shiga; Shigeru Yamamoto, Kyoto, both of Japan

[73] Assignee: Nippon Electric Glass Company, Limited, Shiga, Japan

[21] Appl. No.: 357,657

[22] Filed: May 25, 1989

Related U.S. Application Data

[63] Continuation of Ser. No. 92,132, Sep. 2, 1987, abandoned.

[30] Foreign Application Priority Data

Sep. 17, 1986 [JP] Japan ................ 61-218743

[51] Int. Cl.$^5$ ............................................. C03C 8/00
[52] U.S. Cl. .......................................... 501/66; 501/67
[58] Field of Search ................................. 501/66, 67

[56] References Cited

U.S. PATENT DOCUMENTS 4,640,900  2/1987  Kokubu et al. ................. 501/57

FOREIGN PATENT DOCUMENTS 60-118648   6/1985  Japan ................. 501/66
60-141642   7/1985  Japan ................. 501/66
60-215547  10/1985  Japan ................. 501/66
2115404     9/1983  United Kingdom ..... 501/66

Primary Examiner—Brian E. Hearn
Assistant Examiner—Andrew Griffis
Attorney, Agent, or Firm—Kurt Kelman

[57] ABSTRACT

Substrates for use in liquidus crystal display devices using thin film transistors, solar cells electroluminescence display devices and/or other devices having a thin film formed on the substrate are formed of a glass. The glass is essentially free from alkali metal oxide, lead oxide, and magnesium oxide, and has a high chemical resistance. The glass consists essentially, by weight, of 52-60% SiO$_2$, 7-14% Al$_2$O$_3$, 3-12% B$_2$O$_3$, 3-13% CaO, 10-22% BaO, 0-10% SrO, 0-10% ZnO.

1 Claim, No Drawings

$SIO_2$-$AL_2O_3$-$BAO$ GLASS SUBSTRATES WITH IMPROVED CHEMICAL RESISTANCE FOR USE IN DISPLAY PANELS AND OTHERS HAVING THIN FILMS

REFERENCE TO RELATED APPLICATIONS:

This is a continuation of application of application Ser. No. 092,132, filed Sept. 1, 1987, for "$SiO_2$-$Al_2O_3$-$B_2O_3$-$BaO$ GLASS SUBSTRATES WITH IMPROVED CHEMICAL RESISTANCE FOR USE IN DISPLAY PANELS AND OTHERS HAVING THIN FILMS", now abandoned.

BACKGROUND OF THE INVENTION (1) Field of the Invention

The present invention relates to glass substrates for use in liquid crystal display devices using thin film transistors (TFT), solar cells electroluminescence display devices and/or other devices having a thin film formed on the substrate, and in particular, to such a substrate having an improved chemical resistance.

(2) Description of the Prior Art

As a glass for use in solar cells which is chemically, electrically, and physically compatible with silicon deposited on the substrate by the vapour deposition and which, in particular, has a linear thermal expansion coefficient closely matching that of silicon over entire temperature range from the vapour deposition temperature down to room temperature while, being chemically inert with respect to the materials used in the vapour deposition process, U.S. Pat. No 4,180,618 (Reference 1) by J. W. Alpha et.al. assigned to Corning Glass Works discloses a glass substrate which is an alkaline earth metal aluminosilicate glass consisting essentially, by weight, of about 55-75% $SiO_2$, 5-25% $Al_2O_3$, and at least one alkaline earth metal oxide selected from the group consisting of 9-15% CaO, 14-20% SrO, 18-26% BaO, and mixtures thereof in a total amount equivalent on a molar bases to 9-15% CaO.

U.S. Pat. No. 4,634,683 (Reference 2) and Ser. No. 4,634,684 (Reference 3), both being issued to W. H. Dumbaugh, Jr. and assigned to Corning Glass Works disclose glass substrates for use in liquid crystal display devices using TFT, which are free from alkali metal ions and are transparent, flat, smooth, inert, compatible with silicon, in terms of thermal expansion, and capable of withstanding processing temperature of at least 850° C.

The substrate glass disclosed in Reference 2 consists essentially of extremely fine-grained crystals homogeneously dispersed in a glass matrix, the base glass therefor being essentially free from alkali metal oxide and consisting essentially, in mole percent, of 2-6% BaO, and/or SrO, 18-26% $Al_2O_3$, and 68-80% $SiO_2$.

The substrate of the Reference 3 is prepared from a strontium aluminosilicate glass consisting essentially, in mole percent, of about 9-12% SrO, 9-12% $Al_2O_3$, and 77-82% $SiO_2$.

Generally speaking, a thin film such as silicon, after deposited on a substrate, is formed into a desired pattern by means of the photo etching to produce an operable device. In the photo etching process, various acids such as sulfuric acid, hydrofluoric acid and/or others and alkali solutions are used. Therefore, the substrate is required to have a chemical resistance to those acids and alkali solutions.

In References 1-3, the substrates disclosed therein are chemically inert to materials used in the vapour deposition process, but References 1-3 are silent as to whether or not those substrates are inert to materials used in the photo etching process.

The substrates disclosed in References 1 and 2 and the almost all substrates disclosed in Reference 3 contain a comparatively large amount of $Al_2O_3$, such as more than 15% by weight. $Al_2O_3$ tends to react with ammonium ions and hydrofluoric ions of buffered hydrofluoric acid (which is hydrofluoric acid to which ammonium fluoride is added as a buffer) used in the photo etching process, and the surface of the substrate is clouded in white. It is impossible to remove the white cloud by cleaning with water or other solutions. Although the white cloud can be rubbed off by, for example, sponge, the surface of substrate is injured.

Some of substrates disclosed in References 1 and 3 includes MgO which also reacts with ammonium ions and hydrofluoric ions to cloud the substrate surface white.

Further, the aluminosilicate glass as disclosed in References 1-3 has a considerably high melting temperature and a high liquidus temperature. Therefore, it is quite difficult to form an article of a desired shape as well as to produce a homogeneous glass without bubbles, inclusions, stones, striae, and others. In order to resolve the difficulty, it may be considered to use PbO as a flux in the glass. But, PbO evaporates from the glass melt and pollutes the circumference.

Another known glass for such substrates is $SiO_2$—$B_2O_3$—$Al_2O_3$—BaO glass such as 7059 produced and sold by Corning Glass Works. Although the glass includes a reduced $Al_2O_3$ and no MgO, an amount of $SiO_2$ is small so that the glass is not so sufficient in acid resistance. Therefore, the glass reacts with acids, such as sulfuric acid and others used in the photo etching process and the substrate surface is also clouded white. The glass further does not have a sufficient high strain point and is not good in the heat resistance.

DESCRIPTION OF THE INVENTION

Accordingly, it is an object of the present invention to provide a glass substrate for use in a TFT liquid crystal display device, an solar cell and/or others having a thin film formed on the substrate, which substrate has an improved chemical resistance, in particular, a high resistance to buffered hydrofluoric acid and is easy in melting for removing the bubbles, striae and other defects, as well as excellent in heat resistance and a liner thermal expansion.

Briefly speaking, the present invention attempts to use $SiO_2$ of 52% by weight or more to thereby improve a resistance to sulfuric acid and to use a reduced amount of $Al_2O_3$ of 14% or less by weight without inclusion of MgO to thereby enhance a resistance to the buffered hydrofluoric acid. Further, melting property of the glass is improved by containing appropriate amounts of $B_2O_3$ and CaO.

According to the present invention, a substrate for use in an electronic display device, an solar cell and/or others having a thin film formed on the substrate is characterized in that the substrate is prepared from a glass essentially free from alkali metal oxide, lead oxide, and magnesium oxide, having a high chemical resistance, and consisting essentially, by weight, of 52-60% $SiO_2$, 7-14% $Al_2O_3$, 3-12% $B_2O_3$, 3-13% CaO, 10-22% BaO, 0-10% SrO, 0-10% ZnO.

According to a preferred aspect, the glass consists essentially, by weight, of 55-58% $SiO_2$, 8-13% $Al_2O_3$, 4-10% $B_2O_3$, CaO, 11-20% BaO, 0-5% SrO, 0.5-7% ZnO.

A description will be made as to reasons why amounts of ingredients are restricted as described above.

Use of $SiO_2$ less than 52 wt. % unadvantageously lowers the resistance to sulfuric acid and makes the strain point low to result in a low heat resistance. While, $SiO_2$ of an amount of more than 60 wt. % increases a viscosity at a high temperature and reduces a melting property and the liquidus temperature is elevated so that a defect such as a devitrification of cristobalite tends to be present in the glass. Therefore, the amount of $SiO_2$ is restricted within a range of 52-60 wt. %, preferably 55-58 wt. %.

When an amount of $Al_2O_3$ is less than 7 wt. %, the glass tends to devitrify because the liquidus temperature is considerably elevated. However, if $Al_2O_3$ is excessive of 14 wt. %, the glass reacts with the buffered hydrofluoric acid and makes a white cloud in the substrate surface. Therefore, the amount of $Al_2O_3$ is restricted 7-14 wt. %, preferably 8-13 wt. %.

$B_2O_3$ is used as a flux for lowering a viscosity of the glass and making it easy to melt the glass. If an amount of $B_2O_3$ is less than 3 wt. %, no effect of the flux is expected. But, $B_2O_3$ exceeding 12 wt. % deteriorates the resistance to sulfuric acid of the glass and lowers the strain point of the glass to result in an insufficient heat resistance. Accordingly, $B_2O_3$ is used in a range of an amount of 3-12 wt. %, preferably 4-10 wt. %.

CaO is an ingredient used for making the glass be readily melted and for lowering the glass viscosity at a high temperature. In order to obtain an effect of CaO, at least 3 wt. % of CaO is required to be included in the glass. But, if it is more than 13 wt. %, a resultant glass tends to b clouded white in the buffered hydrofluoric acid. Therefore, amount of CaO is restricted to be 3-13 wt. %, preferably 4-7 wt. %.

BaO is an additive for improving melting property and forming property of the glass without degradation of the resistance to the buffered hydrofluoric acid of the glass. In order to insure the effect of the BaO, at least 10 wt. % of BaO must be added into the glass, but it cannot be used more than 22 wt. % because the strain point is lowered to degrade the heat resistance of the glass. Therefore, an amount of BaO is 10-22 wt. %, preferably 11-20 wt. %.

SrO up to 10 wt. % can be used for the purpose similar to BaO. However, exceeding 10 wt. % disadvantageously increases devitrification of the glass. Preferably, SrO is used below 5 wt. %.

Use of ZnO up to 10 wt. % increases the resistance to the buffered hydrofluoric acid. Excessive use above 10 wt. % makes a resultant glass easy to devitrify and lowers the strain point with a reduced heat resistance.

The substrate glass according to the present invention can includes such a small amount of $ZrO_2$ and $TiO_2$ that the properties of the glass are not injured. Further, the substrate glass of the present invention can includes a refining agent or agents such as $As_2O_3$, $Sb_2O_3$, $Cl_2$, $SO_3$, and/or others.

EXAMPLES

Samples 1-10 in Tables 1 and 2 are ones according to the present invention, and samples 11 and 12 are comparative ones. Sample 11 is the glass substrate of the above described 7059 by Corning Glass Works.

Each of samples 1-12 was produced by; mixing raw materials to form a batch having each composition shown in the tables; melting the batch in a platinum crucible at a temperature of 1,550° C. for 16 hours to form a molten glass; and pouring the molten glass on a carbon plate to form a glass plate. Then, surfaces of the sample glass plate was polished.

Each sample was subjected to tests for measuring a resistance to sulfuric acid and a resistance to hydrofluoric acid.

The resistance to sulfuric acid was evaluated by observing a surface condition of each sample glass plate after dipping the sample into a 10 wt. % sulfuric acid aqueous solution at 80° C. for 3 hours. A sample was considered bad in the resistance to sulfuric acid which had a white cloudy surface or severely rough surface condition such as a cracked surface, and is marked by × in the Tables. Another sample having a slightly rough surface was considered to be not good and is marked by Δ in the Tables. A sample maintaining the polished surface condition was judged to be good and is marked by O in the Tables.

TABLE 1

| Ingredients | Samples | | | | | |
|---|---|---|---|---|---|---|
| | 1 | 2 | 3 | 4 | 5 | 6 |
| $SiO_2$ (wt %) | 55.8 | 55.8 | 55.8 | 55.8 | 55.5 | 56.5 |
| $Al_2O_3$ (wt %) | 10.0 | 10.0 | 11.0 | 11.0 | 11.0 | 9.0 |
| $B_2O_3$ (wt %) | 7.0 | 9.0 | 7.0 | 7.0 | 9.0 | 6.0 |
| CaO (wt %) | 6.0 | 6.0 | 5.0 | 5.0 | 5.0 | 7.0 |
| BaO (wt %) | 17.3 | 16.3 | 15.3 | 16.3 | 13.2 | 18.7 |
| SrO (wt %) | 1.0 | 1.0 | 3.0 | 1.0 | 5.0 | 1.0 |
| ZnO (wt %) | 2.6 | 2.6 | 2.6 | 3.6 | 1.0 | 1.5 |
| $As_2O_3$ (wt %) | 0.3 | 0.3 | 0.3 | 0.3 | 0.3 | 0.3 |
| MgO (wt %) | — | — | — | — | — | — |
| PbO (wt %) | — | — | — | — | — | — |
| Strain Point (°C.) | 624 | 624 | 632 | 628 | 623 | 635 |
| Temperature (°C.) for $10^{2.5}$ poises | 1511 | 1461 | 1481 | 1492 | 1503 | 1518 |
| Resistance for sulfuric acid | O | O | O | O | O | O |
| Resistance for buffered hydrofluoric acid | O | O | O | O | O | O |

O ... good.
Δ ... not good.
× ... bad.

TABLE 2

| Ingredients | Samples | | | | | |
|---|---|---|---|---|---|---|
| | 7 | 8 | 9 | 10 | 11 | 12 |
| $SiO_2$ (wt %) | 57.5 | 55.5 | 56.0 | 55.8 | 49.0 | 55.0 |
| $Al_2O_3$ (wt %) | 11.5 | 12.0 | 10.0 | 10.5 | 11.0 | 15.0 |
| $B_2O_3$ (wt %) | 8.0 | 8.0 | 5.0 | 9.0 | 15.0 | — |
| CaO (wt %) | 7.0 | 4.5 | 7.0 | 6.0 | — | 9.0 |
| BaO (wt %) | 13.7 | 13.0 | 16.1 | 15.8 | 25.0 | — |
| SrO (wt %) | 1.0 | 1.5 | 3.0 | — | — | — |
| ZnO (wt %) | 1.0 | 5.2 | 2.6 | 2.6 | — | 10.5 |
| $As_2O_3$ (wt %) | 0.3 | 0.3 | 0.3 | 0.3 | — | — |
| MgO (wt %) | — | — | — | — | — | 6.0 |
| PbO (wt %) | — | — | — | — | — | 4.5 |
| Strain Point (°C.) | 643 | 631 | 626 | 624 | 590 | 656 |
| Temperature (°C.) for $10^{2.5}$ poises | 1505 | 1486 | 1493 | 1467 | 1470 | 1360 |
| Resistance for sulfuric acid | O | O | O | O | X | O |
| Resistance for buffered hydrofluoric acid | O | O | O | O | Δ | X |

O ... good.
Δ ... not good.
× ... bad.

The resistance to buffered hydrofluoric acid was judged by viewing a surface condition of each sample glass plate after being dipped for 3 minutes in a buffered hydrofluoric acid comprising 30 wt. % ammonium hydrofluoric acid, 6 wt. % hydrofluoric acid, and the balance water. One having an apparent white cloudy surface was judged bad and is marked by $\neq$ in the Tables, and another having a thin white cloudy surface was judged to be not good and is marked by $\Delta$ in the Tables. One having no white cloud was judged good and is represented by a mark O in the Tables.

It will be understood from Tables 1 and 2 that samples 1–10 according to the present invention are excellent in resistance to sulfuric acid and buffered hydrofluoric acid.

Tables 1 and 2 demonstrate a strain point and a temperature for giving a viscosity of $10^{2.5}$ poises of each sample glass. Samples 1–10 according to the present invention have strain points above 600° C. and therefore, have an excellent heat resistance.

Further, for samples 1–10 according to the present invention, viscosity of $10^{2.5}$ poises is realized at a temperature below 1,520° C. which is considerably low. Accordingly, the glass according to the present invention is good in glass melting property.

What is claimed is:

1. A substrate for use in an electronic display device, a solar cell and/or other devices having a thin film formed on the substrate, said thin film forming an electric circuit by photo-etching treatment, wherein said substrate is comprised of a glass essentially free from alkali metal oxide, lead oxide and magnesium oxide, the glass having a high chemical resistance and consisting essentially of 55–58% $SiO_2$, 8–13% $Al_2O_3$, 4–10% $B_2O_3$, 4–7% CaO, 11–20% BaO, 0–5% SrO and 0.5–7% ZnO, all by weight.

* * * * *